United States Patent [19]

Nishimura et al.

[11] Patent Number: 4,797,723

[45] Date of Patent: Jan. 10, 1989

[54] STACKED SEMICONDUCTOR DEVICE

[75] Inventors: Tadashi Nishimura; Yoichi Akasaka, both of Hyogo, Japan

[73] Assignee: Mitsubishi Denki, K.K., Itami, Japan

[21] Appl. No.: 96,212

[22] Filed: Sep. 8, 1987

Related U.S. Application Data

[63] Continuation of Ser. No. 812,600, Dec. 23, 1985, abandoned, which is a continuation of Ser. No. 444,093, Nov. 24, 1982, abandoned.

[30] Foreign Application Priority Data

Nov. 25, 1981 [JP] Japan ................... 56-191118

[51] Int. Cl.⁴ .............. H01L 27/02; H01L 29/06; H01L 29/04; H01L 29/78
[52] U.S. Cl. ........................... 357/40; 357/4; 357/23.1; 357/23.7; 357/41; 357/49; 357/55; 357/56; 357/59
[58] Field of Search ............. 357/92, 91, 82, 81, 357/49, 56, 40, 26, 16, 30, 4, 31, 32, 41, 42, 55, 59, 23.1, 23.7

[56] References Cited

U.S. PATENT DOCUMENTS

| | | | |
|---|---|---|---|
| 3,564,358 | 2/1971 | Hahnlein | 357/40 |
| 4,286,278 | 8/1981 | Lorenze, Jr. et al. | 357/30 |
| 4,297,721 | 10/1981 | McKenny et al. | 357/41 |
| 4,323,912 | 4/1982 | Koike et al. | 357/30 |
| 4,348,611 | 9/1982 | Ruppel et al. | 357/30 |
| 4,363,963 | 12/1982 | Ando | 357/30 |
| 4,369,458 | 1/1983 | Thomas et al. | 357/30 |
| 4,381,201 | 4/1983 | Sakurai | 357/91 |
| 4,429,325 | 1/1984 | Takasahi et al. | 357/30 |
| 4,498,226 | 2/1985 | Inoue et al. | 357/23.7 |
| 4,500,905 | 2/1985 | Shibata | 357/56 |
| 4,571,609 | 2/1986 | Hatano | 357/59 |

OTHER PUBLICATIONS

H. W. Lam et al., "MOSFETs Fabricated in (100) Single Crystal Silicon-on-Oxide Obtained by a Laser Induced Lateral Seeding Technique", 1980 *IEEE IEDM Technical Digest* (Dec. 1980), pp. 559-561.

*Primary Examiner*—J. Carroll
*Attorney, Agent, or Firm*—Sughrue, Mion, Zinn, Macpeak and Seas

[57] ABSTRACT

A stacked semiconductor device includes a first integrated circuit formed on the principal surface of a semiconductor layer and containing active elements, and a second integrated circuit formed on the first integrated circuit through an insulation layer and containing active elements. The second integrated circuit is formed on that part of the surface of the first integrated circuit which is exclusive of selected active elements, to establish an open space for heat dissipation.

6 Claims, 3 Drawing Sheets

STACKED SEMICONDUCTOR DEVICE

This is a continuation of application Ser. No. 812,600 filed Dec. 23, 1985, abandoned, which is a continuation of application Ser. No. 444,093, filed Nov. 24, 1982, abandoned.

BACKGROUND OF THE INVENTION

The present invention relates to a stacked, high-packaging-density and multi-function semiconductor device, wherein semiconductor layers are stacked one on top of another through an insulation layer and a local conductive layer.

A conventional semiconductor device of the type contemplated by the present invention is shown in FIG. 1, wherein reference numeral 1 is a silicon substrate, 2 is an integrated circuit element formed on the silicon substrate, 3 is an integrated circuit element formed on an overlying semiconductor, 4 is an integrated circuit element formed on another overlying semiconductor, 5 is a semiconductor layer having the topmost integrated circuit, as well as a circuit element thereof, and 6 is a photoelectric sensor which forms the topmost layer of the device of FIG. 1 and is assembled thereto by face-down bonding. The respective semiconductor layers are stacked one on top of another to form areas that are equal in size to the active region (having no pad) of the substrate semiconductor layer.

In the semiconductor device of FIG. 1, the semiconductor layer 6 forms the fifth layer and works as a photoelectric sensor, the layer 5 forms the fourth layer and functions as a preprocessing circuit or an A-D control circuit, third layer 4 is responsible for image processing and storage, second layer 3 forms a display D-A circuit, and the first layer 2 is an image processing CPU. With such a configuration, the conventional stacked semiconductor device has some technical difficulties with heat dissipation and conduction between each layer and needs improvement in the crystallinity of each semiconductor layer. In addition, the reliability and production yield of the device are low.

SUMMARY OF THE INVENITON

Therefore, an object of the present invention is to provide a reliable stacked semiconductor device. This object can be achieved by a configuration in which an overlying semiconductor is not formed on at least part of a specific semiconductor layer. By forming a heat dissipating circuit in this open space, efficient air cooling of the device can be accomplished and an electrical connection between each layer can be easily established by a conventional method. As another advantage, the crystallinity of overlying semiconductor layers formed in the remaining portions can be improved.

DETAILED DESCRIPTION OF THE PREFERRED EMBODIMENTS

Figure 1:
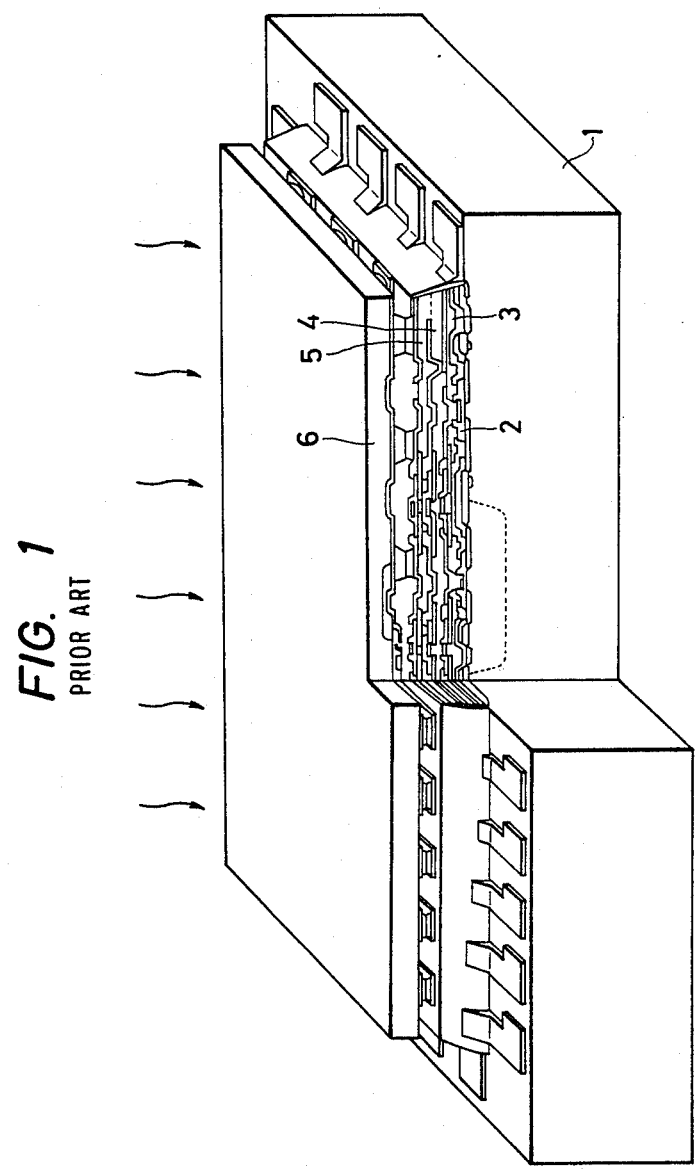
FIG. 1 is a perspective view of a conventional multi-layered integrated circuit.
Figure 2:
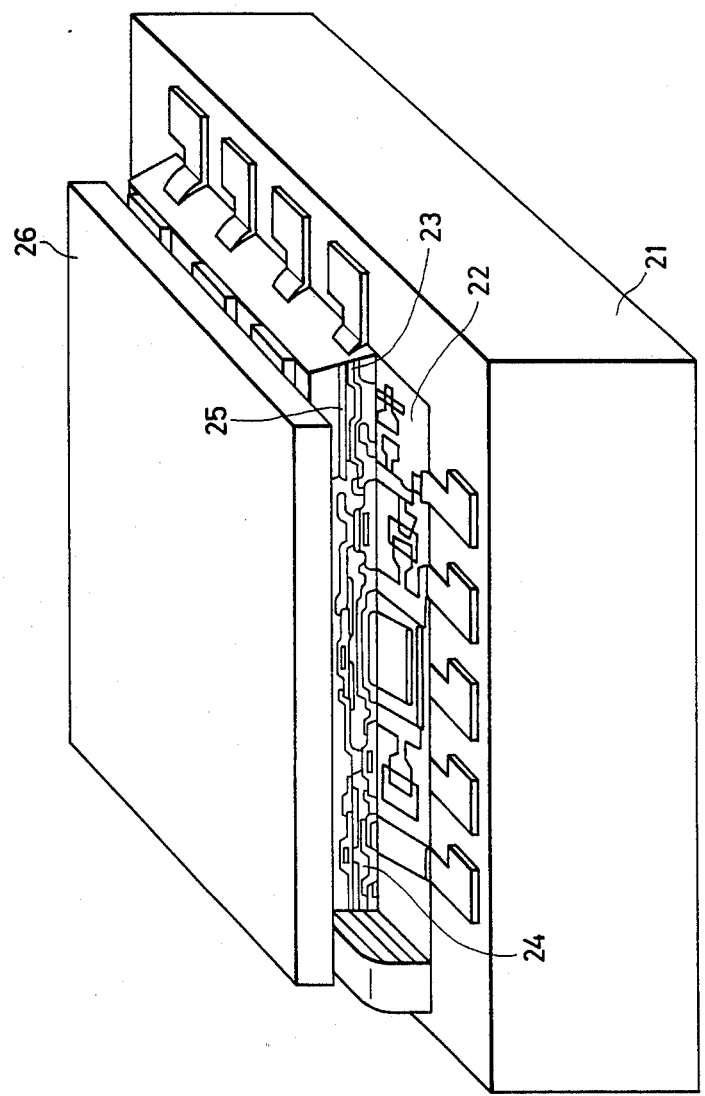
FIG. 2 is a perspective view of a stacked semiconductor device according to one embodiment of the present invention.

FIG. 2 is a perspective view of a stacked semiconductor device according to one embodiment of the present invention, in which reference numeral 21 is a silicon substrate, and 22 is an integrated circuit formed on the silicon substrate as the first layer. The circuit 22 is an image processing circuit which is the heart of the entire device and is made up of an emitter coupled logic (ECL) circuit. To achieve maximum heat dissipation, no semiconductor layer is formed on this circuit. The second layer 23, third layer 24 and fourth layer 25 provide a display circuit, an image processing/storage circuit and an A-D control circuit, respectively. Only the fifth layer 26 assembled onto the device by face-down bonding is formed over the entire portion of the first layer. The second semiconductor layer is formed on only a selected part of the first layer, and by so doing, the two layers can be electrically connected without the need of special techniques such as "through-hole" plating.

Figure 3:
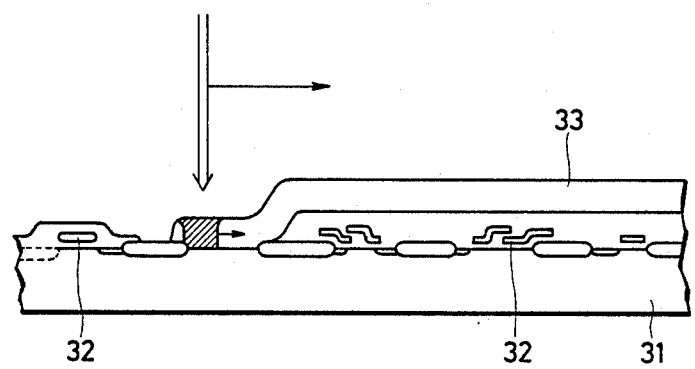
FIG. 3 illustrates how a monocrystalline layer is formed by the laser recrystallization technique in the fabrication of the embodiment of FIG. 2.

A method of forming the second layer is shown in FIG. 3, wherein 31 is a silicon substrate, 32 is an integrated circuit element formed on the first layer, and 33 is a second semiconductor layer formed on an intervening insulation layer. As shown, the second semiconductor layer is illuminated by scanning with a continuous wave (CW)-laser or CW electron beam from an opening in the first layer to the overlying region on an intervening insulation layer and recrystallized and the crystallinity of the second semiconductor layer is improved by using the crystalline region of an opening in the first layer as a seed.

In the embodiment of FIG. 2, part of the first layer is left uncovered by the second and subsequent layers, but it is to be understood that the non-overlaid layers may be the third and/or subsequent layers. Which layer should be left partially open depends on the specific circuit configuration, and any layer that requires effective heat dissipation and which has a delicate circuit formed thereon should be left partially uncovered by an overlying layer or layers.

As described above, the device of the present invention is partially hollow or has no overlying semiconductor layer on some part or parts of a specific layer, to obtain the above noted advantages, achieve high reliability and enable manufacture at low cost.

What is claimed is:

1. A stacked semiconductor device comprising:
   a first semiconductor layer having formed at least partially therein a first plurality of active integrated circuit elements containing a large number of circuit elements and at least one additional coplanar complete active integrated circuit having a relatively high heat generating capacity to thereby provide said stacked semiconductor device with an improved heat dissipating ability, said first plurality of elements and said one additional circuit forming a first integrated circuit;
   an insulating layer formed upon and continuously and uniformly contacting and covering all of said first plurality of elements and leaving exposed all of said one additional circuit; and
   a second semiconductor layer formed upon and continuously and uniformly covering and contacting said insulating layer and leaving exposed all of said one additional integrated circuit and having formed at least partially therein a second plurality of active integrated circuit elements, said second plurality of elements forming a second integrated circuit.

2. A stacked semiconductor device as recited in claim 1, wherein said second semiconductor layer further contacts a portion of said first semiconductor layer.

3. A stacked semiconductor device according to claim 1, each of the first and second integrated circuits being made of more than one layer.

4. A stacked semiconductor device as recited in claim 1, wherein said second semiconductor layer has a contacting portion in contact with said first semiconductor layer at a location between said one additional circuit and said first plurality of active integrated circuit elements and is recrystallized in situ from said contacting portion.

5. A stacked semiconductor device comprising:
a first semiconductor layer having formed at least partially therein a first plurality of active integrated circuit elements containing a large number of circuit elements and at least one additional coplanar complete active integrated circuit having a relatively high heat generating capacity to thereby provide said stacked semiconductor device with an improved heat dissipating ability, said first plurality of elements and said one additional circuit forming a first integrated circuit;

an insulating layer formed upon and continuously and uniformly contacting and covering all of said first plurality of elements and leaving exposed all of said one additional circuit;

a second semiconductor layer formed upon and continuously and uniformly covering and contacting said insulating layer and leaving exposed all of said one additional integrated circuit and having formed at least partially therein a second plurality of active integrated circuit elements, said second plurality of elements forming a second integrated circuit; and at least one further stacked layer formed over said second semiconductor layer, and including a portion formed over said first plurality of active integrated circuit elements but being spaced therefrom.

6. A stacked semiconductor device according to claim 5, a heat dissipation region being formed between an exposed surface of said first semiconductor layer and a confronting surface of said portion formed over said first plurality of active integrated circuit elements.

* * * * *